United States Patent
Ando

(10) Patent No.: US 8,411,250 B2
(45) Date of Patent: Apr. 2, 2013

(54) EXPOSURE APPARATUS AND DEVICE MANUFACTURING METHOD

(75) Inventor: Miwako Ando, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 388 days.

(21) Appl. No.: 12/143,898

(22) Filed: Jun. 23, 2008

(65) Prior Publication Data

US 2009/0002665 A1 Jan. 1, 2009

(30) Foreign Application Priority Data

Jun. 27, 2007 (JP) ................. 2007-169486

(51) Int. Cl.
*G03B 27/54* (2006.01)
*G03B 27/42* (2006.01)

(52) U.S. Cl. .......................... 355/67; 355/53

(58) Field of Classification Search .............. 355/52, 355/53, 55, 67; 356/399–401
See application file for complete search history.

(56) References Cited

U.S. PATENT DOCUMENTS

| 6,310,680 B1 * | 10/2001 | Taniguchi ............... 355/53 |
| 6,654,097 B1 * | 11/2003 | Nishi ................. 355/53 |
| 2006/0279717 A1 * | 12/2006 | Hirano ............... 355/53 |
| 2007/0081138 A1 * | 4/2007 | Kerkhof et al. ......... 355/71 |
| 2008/0062392 A1 * | 3/2008 | Amano ............... 355/52 |

FOREIGN PATENT DOCUMENTS

| JP | 2000-077300 A | 3/2000 |
| JP | 2000-340488 A | 12/2000 |
| JP | 2002-195912 A | 7/2002 |
| JP | 2007-110116 A | 4/2007 |

* cited by examiner

*Primary Examiner* — Hung Henry Nguyen
(74) *Attorney, Agent, or Firm* — Canon U.S.A., Inc. IP Division

(57) ABSTRACT

An exposure apparatus includes a measurement system which performs exposure control measurement using a first mark arranged on an original stage and a second mark arranged on a substrate stage, and a control unit which can set, when the measurement system performs the measurement in order to expose a substrate to light under a certain illumination condition, an illumination condition different from the certain illumination condition.

12 Claims, 9 Drawing Sheets

------- IDEAL WAVEFORM
——— LOW SIGNAL WAVEFORM

------- WAVEFORM EXHIBITING HIGH S/N RATIO
——— WAVEFORM EXHIBITING LOW S/N RATIO

——— WAVEFORM HAVING PLURALITY OF PEAKS

--Prior Art--

EXPOSURE APPARATUS AND DEVICE MANUFACTURING METHOD

BACKGROUND OF THE INVENTION

1. Field of the Invention

The present invention relates to an exposure apparatus which projects the pattern of an original onto a substrate via a projection optical system to expose the substrate to light, and a device manufacturing method.

2. Description of the Related Art

A full-plate exposure apparatus such as a stepper or a scanning exposure apparatus such as a scanner can be employed to manufacture a device such as a semiconductor device.

FIG. 9 is a view showing the schematic arrangement of an exposure apparatus. A light source LS can be, for example, a superhigh pressure mercury lamp (g-line (wavelength: about 436 nm) or i-line (wavelength: about 365 nm)), a KrF excimer laser (wavelength: about 248 nm), or an ArF excimer laser (wavelength: about 193 nm). A light beam emitted by the light source LS is supplied to an illumination optical system IL. The illumination optical system IL illuminates a set region on an original (also called a reticle or mask) under set illumination conditions. A fine circuit pattern to be transferred onto a photosensitive agent applied on a substrate WF is formed on the original RT. The pattern formed on the original RT is projected onto the substrate WF via a projection optical system PO. Along with the recent trend toward the micropatterning of integrated circuits, a very high demand has arisen for increasing the alignment accuracy between the original RT and the substrate WF in substrate exposure. To ensure high productivity, it is also necessary to complete alignment measurement in a short period of time.

An example of an alignment measurement system is the TTL (Through The Lens) measurement system as shown in FIG. 9. The TTL measurement system images a projected image of a slit pattern, which is formed on an original reference plate RFP that is flush with the original RT held by an original stage RS, in the vicinity of a reference slit on a substrate reference plate WFP arranged on a substrate stage WS. Light transmitted through the reference slit is detected by a sensor IS. The original slit pattern may be formed not on the original reference plate RFP but on the original RT. For the sake of simplicity, the following description assumes that the original slit is formed on the original reference plate RFP.

More specifically, as shown in FIG. 2A, a plurality of marks are formed on the original reference plate RFP to allow measurement at a plurality of image heights in the exposure region. Each mark includes a plurality of slits. Light having passed through the slit of the mark on the original reference plate RFP is transmitted through the reference slit on the substrate reference plate as shown in FIG. 2B, and detected by the sensor IS. Measurement is performed by monitoring a detection signal from the sensor IS while changing the relative positional relationship between the mark on the original reference plate RFP and the mark on the substrate reference plate WFP. At this time, focus measurement is performed by monitoring a detection signal from the sensor IS while moving the mark on the original reference plate RFP and/or the mark on the substrate reference plate WFP along the optical axis of the projection optical system PO. The relative position between the original stage RS and the substrate stage WS in the horizontal direction is measured by monitoring a detection signal from the sensor IS while moving the mark on the original reference plate RFP and/or the mark on the substrate reference plate WFP along a plane perpendicular to the optical axis of the projection optical system PO.

FIG. 3 illustrates an example of the detection signal from the sensor IS in the TTL measurement system, which assumes a point at which the amount of light is maximum as a best point (BP). The waveform of the detection signal is influenced by the illumination conditions (e.g., the effective light source distribution and amount of light) of the illumination optical system IL shown in FIG. 9.

Along with the recent micropatterning, various types of illumination conditions such as illumination which uses a small annular zone ratio, very-low-σ illumination, and dipole illumination have come to be set for the illumination optical system IL. The above-described TTL measurement system is required to be always capable of alignment measurement even under these various types of illumination conditions.

Unfortunately, a detection signal exhibiting a small overall light amount as illustrated in FIGS. 4A and 4B leads to deterioration in the accuracy of determining a point at which the amount of light is a maximum. A detection signal having a plurality of peaks as illustrated in FIG. 4C results from erroneous detection at a very high probability. High-accuracy alignment is also difficult when using detection signals obtained under an illumination condition under which illuminance nonuniformity occurs or that under which the pole balance is bad, because the maximum amount of light does not match the best point.

SUMMARY OF THE INVENTION

The present invention has been made in consideration of the above-described problem, and has as its object to suppress an excessive decrease in measurement accuracy attributed to a substrate exposure illumination condition.

The first aspect of the present invention relates to an exposure apparatus which includes an illumination optical system which can change an illumination condition, an original stage which holds an original, a projection optical system, and a substrate stage which holds a substrate, and illuminates the original by the illumination optical system to project the pattern of the original onto the substrate via the projection optical system. The exposure apparatus includes a measurement system which performs exposure control measurement using a first mark arranged on the original stage and a second mark arranged on the substrate stage, and a control unit which can set, when the measurement system performs the measurement in order to expose the substrate to light under a certain illumination condition, an illumination condition different from the certain illumination condition.

The second aspect of the present invention relates to a device manufacturing method of manufacturing a device using an exposure apparatus which includes an illumination optical system which can change an illumination condition, an original stage which holds an original, a projection optical system, and a substrate stage which holds a substrate, and illuminates the original by the illumination optical system to project the pattern of the original onto the substrate via the projection optical system. The manufacturing method includes the steps of setting, when substrate exposure measurement is performed under a first illumination condition, a second illumination condition different from the first illumination condition, and setting the first illumination condition when exposure is performed based on the result of the measurement.

According to the present invention, it is possible to suppress an excessive decrease in measurement accuracy attributed to a substrate exposure illumination condition.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

Figure 1:
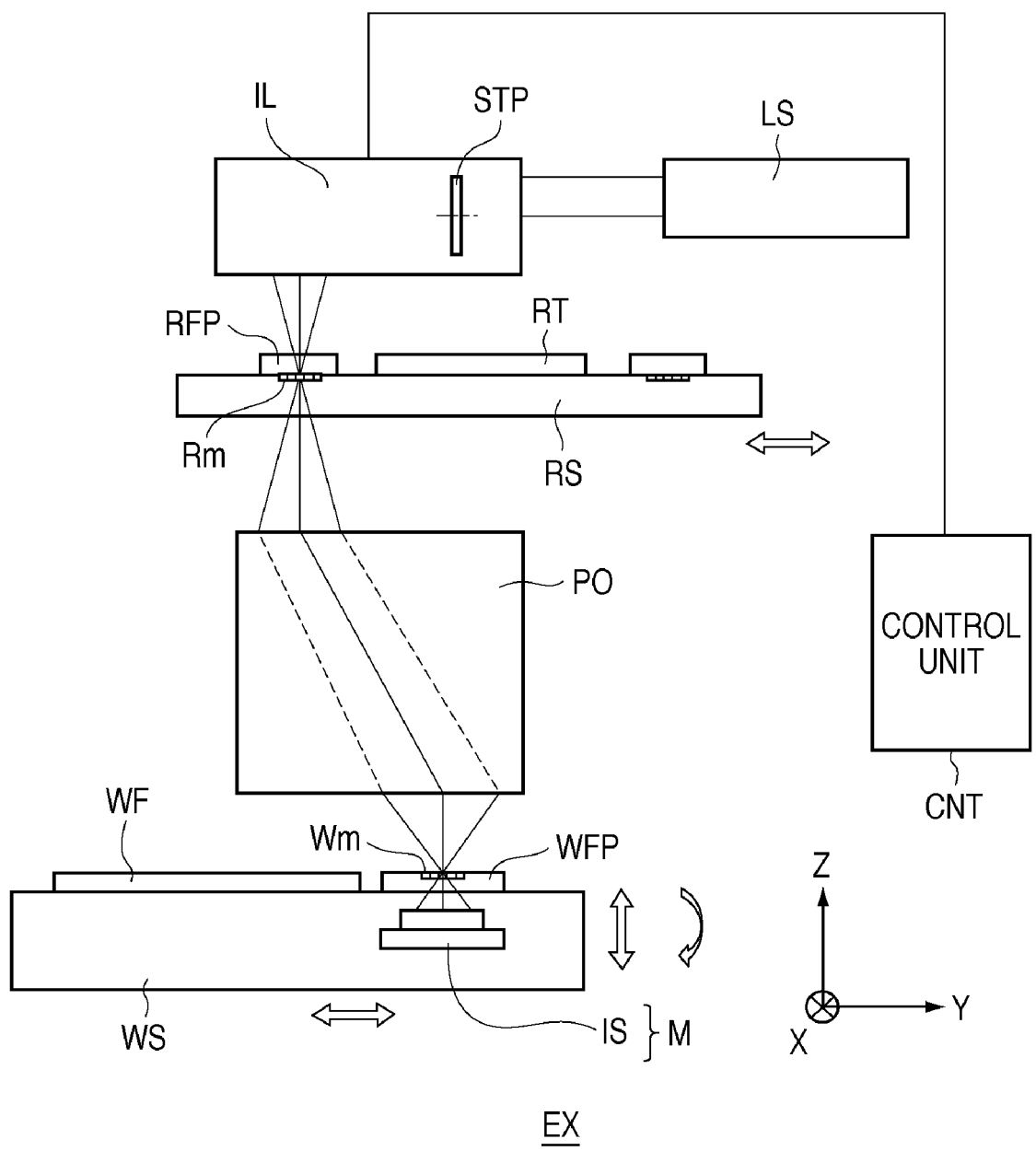
FIG. 1 is a view showing the schematic arrangement of an exposure apparatus according to a preferred embodiment of the present invention.

FIG. 1 is a view showing the schematic arrangement of an exposure apparatus according to a preferred embodiment of the present invention. An exposure apparatus EX according to the preferred embodiment of the present invention comprises an illumination optical system IL, original stage RS, projection optical system PO, substrate stage WS, control unit CNT, and measurement system M.

The illumination optical system IL can change the illumination condition (e.g., the effective light source distribution) under which it illuminates an original RT and first measurement marks Rm (to be described later). The illumination optical system IL illuminates the original RT held by the original stage RS under an illumination condition designated by the control unit CNT. The pattern of the original RT illuminated by the illumination optical system IL is projected onto a substrate WF held by the substrate stage WS via the projection optical system PO, thereby exposing the substrate WF to light. The illumination optical system IL can include, for example, a plurality of exchangeable illumination stops, a plurality of exchangeable or drivable diffractive optical elements, and zoom lenses to change the illumination condition.

The measurement system M includes a sensor IS for detecting light (light amount) and performs exposure control measurement using the first marks Rm arranged on the original stage RS and second marks Wm arranged on the substrate stage WS. The exposure control measurement herein can include, for example, focus measurement and/or alignment measurement between the original stage RS and the substrate stage WS.

The control unit CNT can set, for example, the illumination condition under which the illumination optical system IL illuminates the original RT and first marks Rm. When the measurement system M performs measurement in order to expose the substrate WF to light under a certain illumination condition, the control unit CNT can set an illumination condition different from the certain illumination condition for the illumination optical system IL.

The original RT and substrate WF are placed at nearly, optically conjugate positions via the projection optical system PO. The illumination optical system IL illuminates a slit-like region, which extends in the X direction, on the original RT with a uniform illuminance distribution. In exposing the substrate WF to light, the original stage RS and substrate stage WS are driven relative to the optical axis of the projection optical system PO at a speed ratio corresponding to the optical magnification of the projection optical system PO. This makes it possible to scanning-expose the substrate WF to light.

The original stage RS is positioned by a positioning mechanism including a laser interferometer and a driving mechanism for driving the original stage RS based on a target position and the position measurement result of the original stage RS, which is obtained by the laser interferometer. An original reference plate RFP is fixed near the original RT. The reflecting surface of the original reference plate RFP is nearly flush with the pattern surface of the original RT. A plurality of first marks Rm made of a metal such as Cr or Al is formed on the reflecting surface of the original reference plate RFP. The original stage RS is driven while its position in the Z direction (vertical direction) is kept constant relative to the projection optical system PO. A moving mirror for reflecting a beam from the laser interferometer is fixed on the original stage RS. The laser interferometer sequentially measures the position of the original stage RS. Although a case in which the first marks Rm are formed on the reflecting surface of the original reference plate RFP will be exemplified herein, the first marks Rm may be formed on the original RT.

A substrate reference plate WFP is fixed near the substrate WF. The reflecting surface of the substrate reference plate WFP is nearly flush with the upper surface of the substrate WF. A plurality of second marks Wm made of a metal such as Cr or Al are formed on the substrate reference plate WFP. A driving mechanism for driving the substrate stage WS drives the substrate stage WS in six axial directions, that is, the optical axis direction (Z direction) of the projection optical system PO, two directions (X and Y directions) on a plane perpendicular to the optical axis direction, and the rotation directions (the θ directions along which tilt adjustment is performed with respect to the image plane) about the X-, Y-, and Z-axes. A moving mirror for reflecting a beam from a laser interferometer for measuring the position of the substrate stage WS is fixed on the substrate stage WS. The laser interferometer sequentially measures the position of the substrate stage WS.

There are various types of original illumination conditions of the illumination optical system IL. Normal illumination uses an illumination condition under which the effective light source distribution has a circular shape and uniform light intensity. σ is often used to express the illumination conditions. σ is the ratio of an illumination light transmission region assuming that σ=1 for the Full-NA of the projection optical system PO. An illumination condition closer to σ=1 is called high σ, and that closer to σ=0 is called low σ.

Figure 5A:
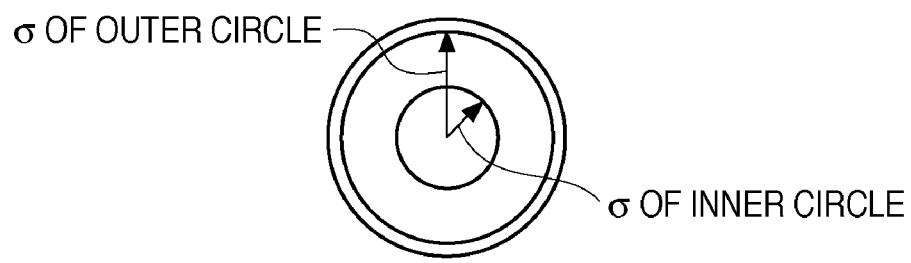
FIGS. 5A to 5C are views illustrating various types of illumination conditions.
Figure 5B:
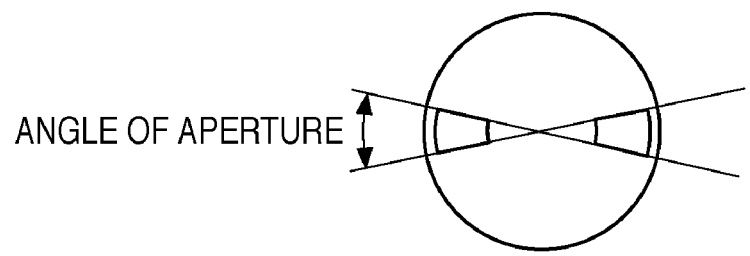
Figure 5C:
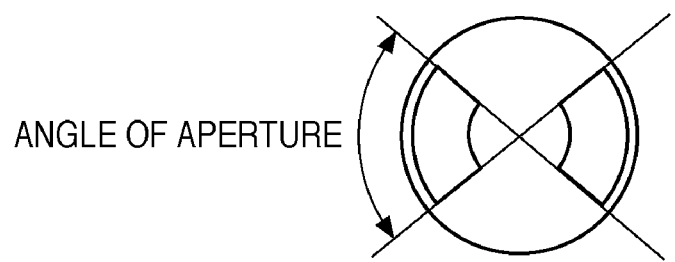

There are also various types of modified illumination such as annular illumination (FIG. 5A) in which the effective light source distribution has a doughnut shape, dipole illumination (FIG. 5B) in which the effective light source distribution is divided into two points, and cross-pole illumination in which the effective light source distribution is divided into four points. In the annular illumination, the ratio between the σ values of the outer and inner circles of the doughnut-shaped effective light source distribution is called the annular zone ratio. The dipole illumination and cross-pole illumination can be normally generated by shielding an unnecessary portion of the effective light source distribution in the annular illumination against light and extracting a necessary portion from it. The angle of this extraction is called the angle of aperture. For example, it is possible to obtain dipole illumination as shown in FIG. 5B and cross-pole illumination as shown in FIG. 5C from annular illumination as illustrated in FIG. 5A.

The measurement system M will be explained. The measurement system M according to this embodiment is the TTL (Though The Lens) measurement system. The measurement system M includes the first marks Rm formed on the original reference plate RFP or original RT, the second marks Wm formed on the substrate reference plate WFP, and the sensor IS arranged under the second marks Wm on the substrate stage WS. The sensor IS detects light (light amount) transmitted through the second mark Wm.

Figure 2A:
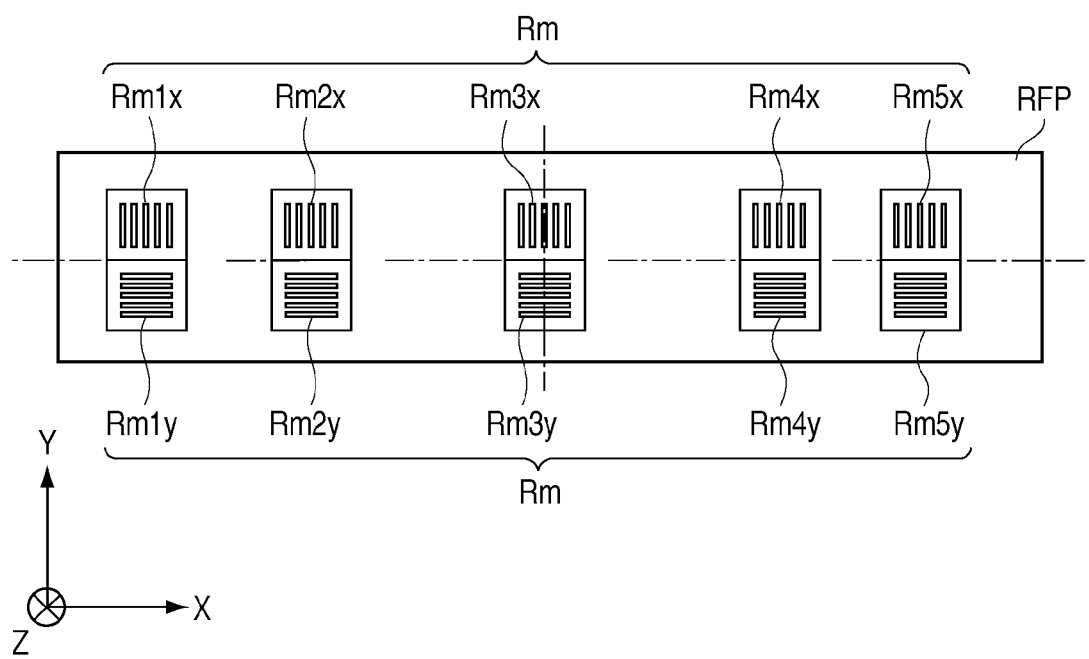
FIG. 2A is a view illustrating a first mark.
Figure 2B:
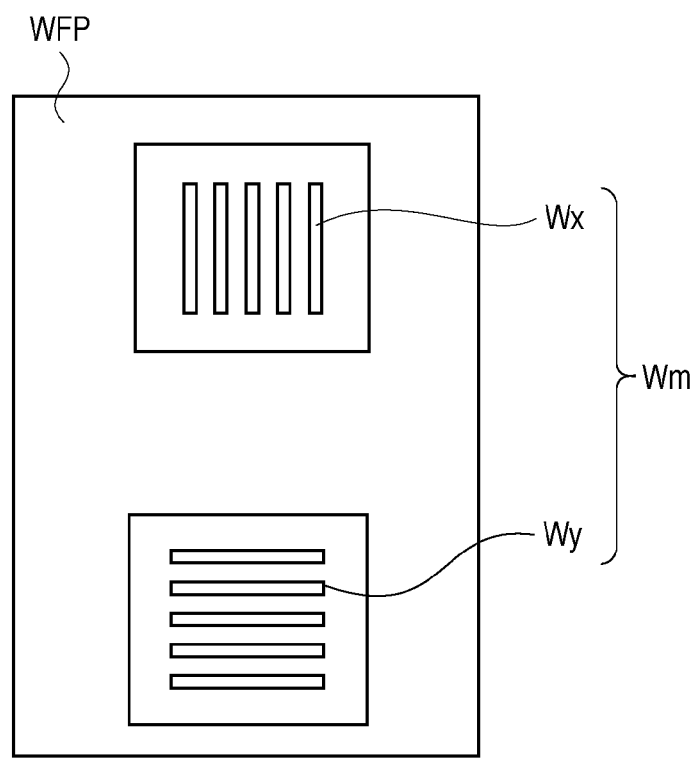
FIG. 2B is a view illustrating a second mark.

As illustrated in FIG. 2A, the plurality of first marks Rm, that is, $Rm1x$ to $Rm5x$ and $Rm1y$ to $Rm5y$ can be formed on the original reference plate RFP. The plurality of first marks Rm may be formed on the original RT, as described above. Each first mark can include a plurality of slits. FIG. 2B shows an arrangement of the second marks Wm, that is, Wx and Wy. The second mark Wx is used for measurement in the X and Z directions. The second mark Wy is used for measurement in the Y and Z directions. Providing two sensors IS in correspondence with the second marks Wx and Wy makes it possible to individually measure the second marks Wx and Wy.

Measurement by the measurement system M will be explained. First, the original stage RS is driven so that the first mark Rm as the original mark is positioned at a predetermined image height in the exposure region.

Next, the substrate stage WS is driven so that the second mark Wm as the substrate mark is positioned near the imaging position of the first mark Rm.

Lastly, the sensor IS detects light transmitted through the second mark Wm while driving the substrate stage WS in the optical axis direction of the projection optical system PO to find a position at which the detection signal (light amount) is a maximum, thereby determining a best focus position for the projection optical system PO at the predetermined image height. In addition, the sensor IS detects light transmitted through the second mark Wm while driving the substrate stage WS in a direction perpendicular to the optical axis of the projection optical system PO to find a position at which the detection signal (light amount) is maximum, thereby obtaining a best position (the position in the X and Y directions) for the substrate stage WS at the predetermined image height.

Figure 3:
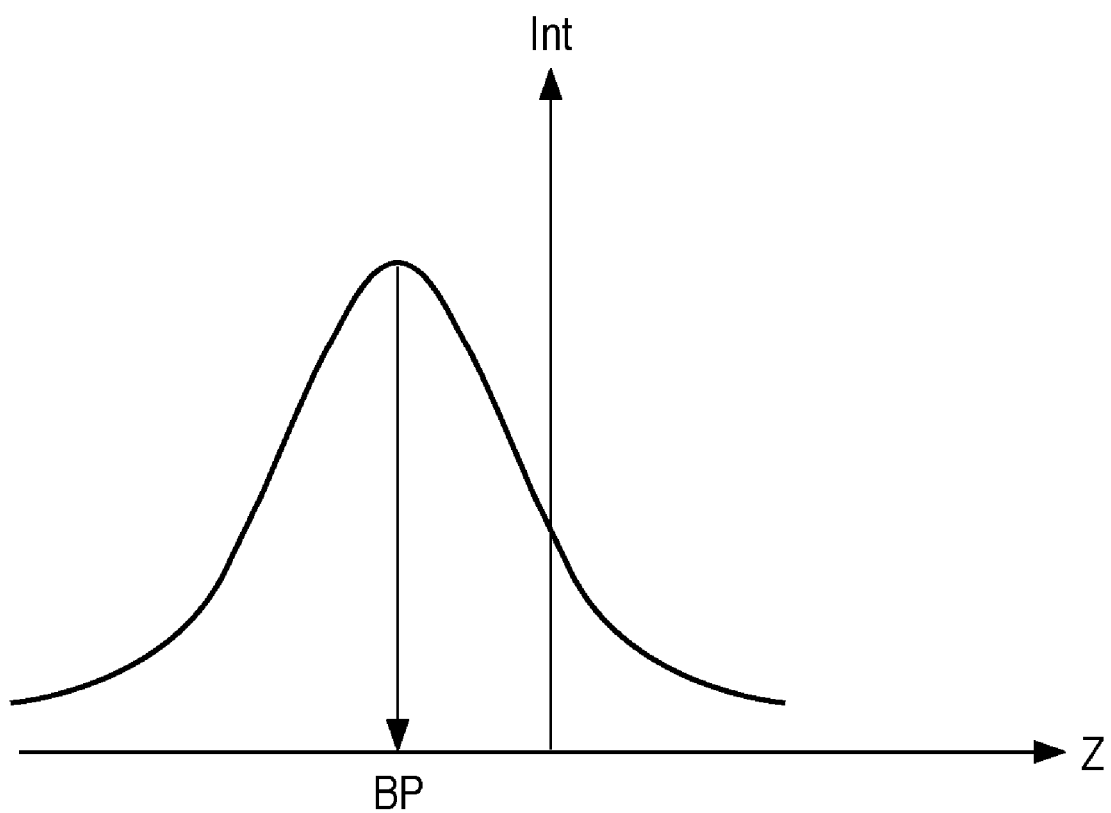
FIG. 3 is a graph illustrating a detection signal from a sensor.

FIG. 3 is a graph illustrating a detection signal from the sensor. A point at which the amount of light is a maximum, which is calculated by, for example, function fitting and barycentric processing of the detection signal, can be determined as a best point (BP).

Processing of determining whether to change the exposure illumination condition (substrate exposure illumination condition) in alignment measurement by the measurement system M will be explained. This determination processing can be done by the control unit CNT based on the result of simulation or preliminary measurement of the substrate exposure illumination condition by the measurement system M.

The preliminary measurement can be performed in advance for a plurality of settable illumination conditions by the measurement system M before the shipment of the exposure apparatus EX or before the start of an exposure job. In this case, a measurement illumination condition is selected and set in accordance with an exposure illumination condition designated by a given exposure job in response to a recipe input to the exposure apparatus.

The preliminary measurement may be performed in accordance with a substrate exposure illumination condition designated by a given exposure job in response to a recipe input to the exposure apparatus. When the preliminary measurement is performed in response to a recipe input to the exposure apparatus, and the preliminary measurement result is unsatisfactory, not the exposure illumination condition but the measurement illumination condition is set for the illumination optical system IL.

Figure 4A:
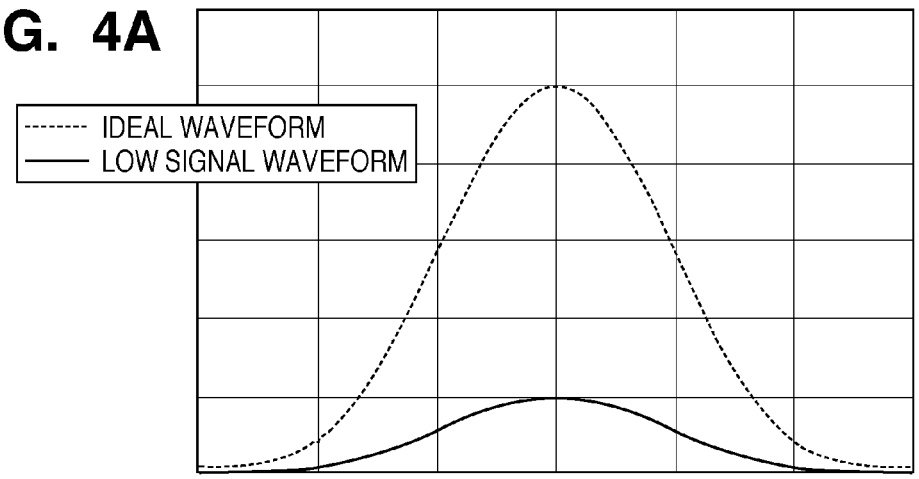
FIG. 4A is a graph illustrating a detection signal from the sensor when the amount of light is small.
Figure 4B:
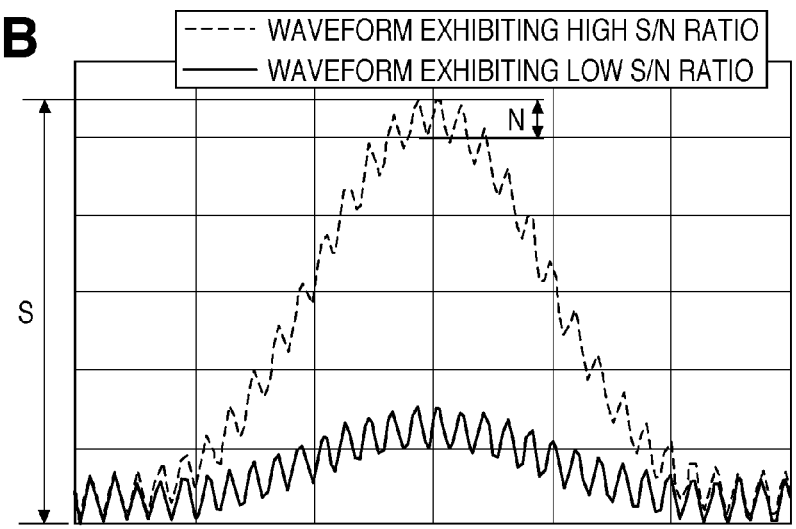
FIG. 4B is a graph illustrating a detection signal from the sensor when the S/N ratio is low.
Figure 4C:
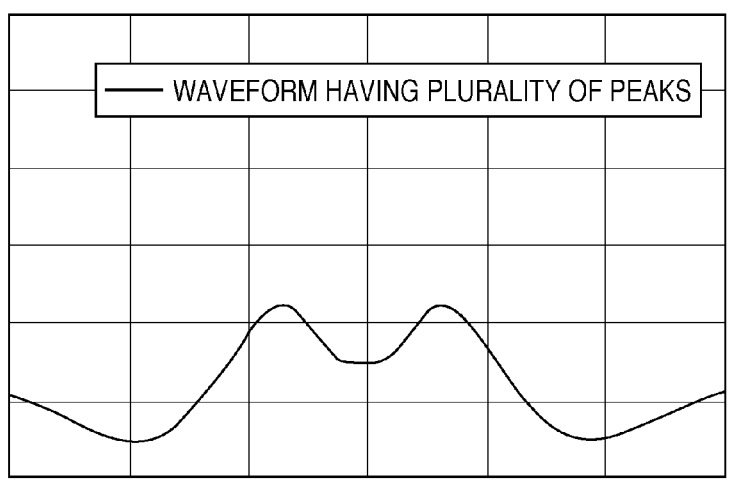
FIG. 4C is a graph illustrating a detection signal having a plurality of peaks.

For example, if the overall light amount is small as illustrated as "Low Signal Waveform" in FIG. 4A, the control unit CNT sets an illumination condition different from the exposure illumination condition in measurement by the measurement system M. If the signal (S)/noise (N) ratio is 10 or less as illustrated as "Waveform Exhibiting Low S/N Ratio" in FIG. 4B, the control unit CNT sets an illumination condition different from the exposure illumination condition in measurement by the measurement system M. If two or more light amount peaks exist as illustrated in FIG. 4C, the control unit CNT sets an illumination condition different from the exposure illumination condition in measurement by the measurement system M.

If the control unit CNT determines to perform measurement under an illumination condition different from the substrate exposure illumination condition, it sets the illumination condition different from the substrate exposure illumination condition for the illumination optical system IL and controls the measurement system M to perform measurement. The substrate exposure illumination condition is generally designated in a substrate exposure control recipe. This recipe is sent to the control unit CNT.

After the measurement is completed, the control unit CNT returns the illumination condition set for the measurement to the exposure illumination condition designated in the recipe. More specifically, after the measurement is completed, the control unit CNT sets the illumination optical system IL so as to return the illumination condition set for the measurement to the exposure illumination condition designated in the recipe.

A method of switching from the exposure illumination condition to the measurement illumination condition in substrate exposure control measurement will be explained.

In the first mode, a dedicated illumination condition such as high σ suitable for the TTL measurement is prepared as the measurement illumination condition. If the control unit CNT determines that illumination condition switching is necessary, it sets this dedicated illumination condition for the illumination optical system IL. The first mode always allows measurement with high accuracy.

The second mode uses an illumination condition under which the time required to drive optical members such as illumination stops, diffractive optical elements, and lenses to be driven to change the exposure illumination condition or an illumination condition having already been set is shortest. The second mode is effective in preventing a decrease in throughput while ensuring high alignment measurement accuracy.

The third mode uses an illumination condition which has high similarities to that which uses the exposure effective light source distribution and does not hinder measurement. The illumination condition having high similarities to that which uses the exposure effective light source distribution is typically an illumination condition which uses the same effective light source shape as that for exposure and an effective light source area different from that for exposure. The illumination condition which does not hinder measurement is typically an illumination condition which uses an effective light source area larger than that for exposure. More specifically, in normal illumination, a plurality of illumination conditions which use different σ values have high similarities in effective light source distribution. When the exposure illumination condition is very low σ, an illumination condition under which σ is sufficiently high but does not hinder position measurement can be set as the measurement illumination condition.

Various types of annular illumination which use different annular zone ratios can be said to have high similarities. When the exposure illumination condition is annular illumination which uses a relatively small annular zone ratio, annular illumination which uses a relatively large annular zone ratio can be set as the measurement illumination condition.

Various types of dipole illumination which use different angles of aperture can be said to have high similarities. When the exposure illumination condition is dipole illumination which uses a relatively narrow angle of aperture, dipole illumination which uses a relatively wide angle of aperture or annular illumination before extraction can be selected as the measurement illumination condition.

The fourth mode uses an illumination condition which ensures an imaging performance close to that for exposure and does not hinder measurement. For example, measurement can be performed under an illumination condition under which imaging performance characteristics such as the image plane size and the aspect ratio of the resolving power predicted on the basis of simulation are close to those of the exposure illumination condition.

The third and fourth modes are advantageous to changing the illumination condition in a short period of time. In these modes, alignment measurement can be performed under an illumination condition close to the exposure illumination condition.

Assume that the measurement illumination condition is determined in accordance with an exposure illumination condition designated in a recipe. In this case, preferably, a table in which the exposure illumination condition is associated with the measurement illumination condition is stored in a memory so that the control unit CNT performs determination by looking up the table. The memory may be set inside or outside, for example, the control unit CNT.

When an exposure illumination condition which is not recorded on this table is designated in a recipe, measurement is performed under the designated illumination condition. If the measurement result is satisfactory, the designated illumination condition is additionally written onto the table as the exposure and measurement illumination conditions. If the measurement result is unsatisfactory, a finally determined measurement illumination condition is additionally written onto the memory by associating it with the designated illumination condition. This learning function shortens the time required to determine the measurement illumination condition by updating the table.

Figure 6:
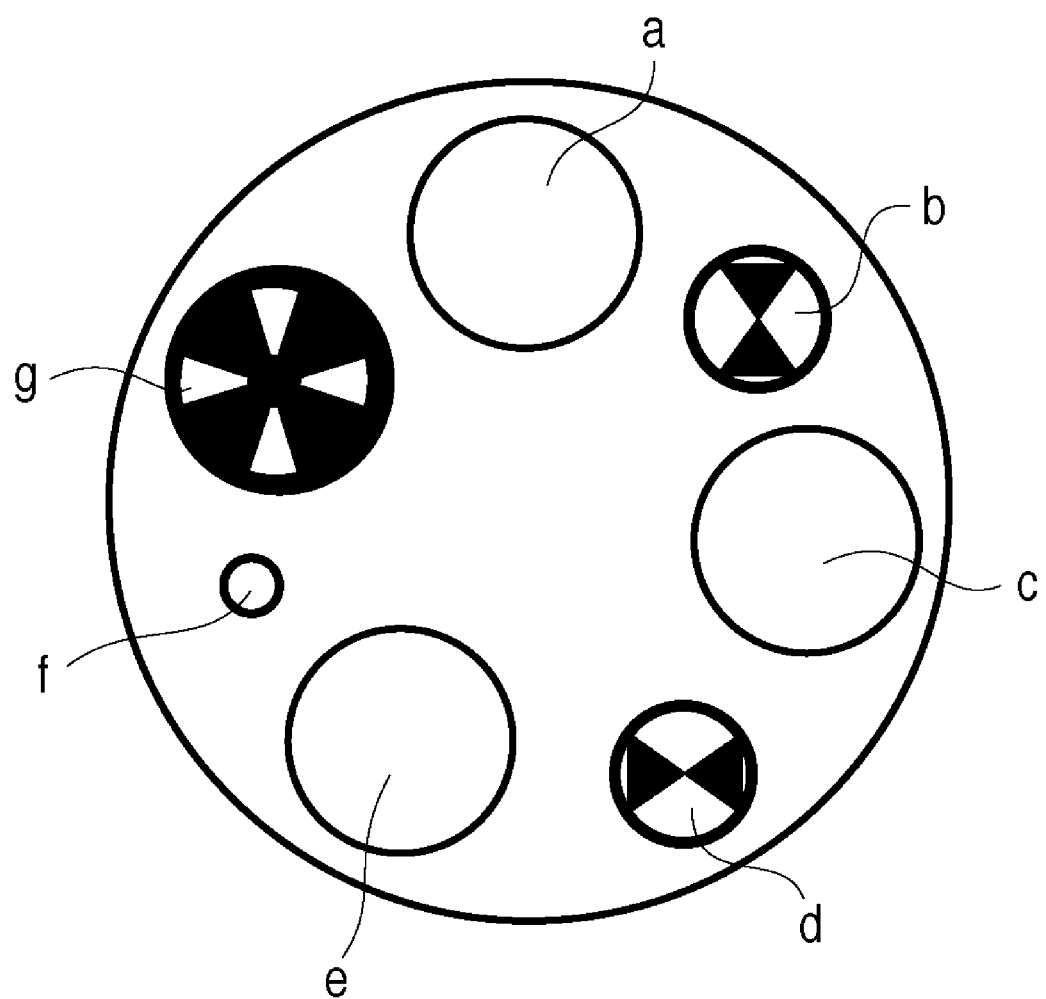
FIG. 6 is a view illustrating a stop plate which is inserted in an illumination optical system and used to change the illumination condition.

FIG. 6 is a view illustrating a stop plate STP which is inserted in the illumination optical system IL and used to change the illumination condition. The stop plate STP has seven stops arranged on a disk, and an arbitrary stop on the stop plate STP is selected by rotating the disk. Reference symbols a, c, and e denote stops for setting high σ as a normal illumination condition; b and d, stops for setting dipole illumination; f, a stop for setting very low σ; and g, a stop for setting cross-pole illumination.

If the stops b, d, f, and g are selected to set the exposure illumination condition, it is possible to quickly change the illumination condition by arranging the stops a, c, and e suitable for the TTL measurement to be physically close to the stops b, d, f, and g. A plurality of stops such as the stops a, c, and e are preferably set as stops which can be selected to set the dedicated illumination condition. Stops which can be selected to set the dedicated illumination condition are preferably arranged close to stops which cannot be selected to set the dedicated illumination condition.

Figure 7:
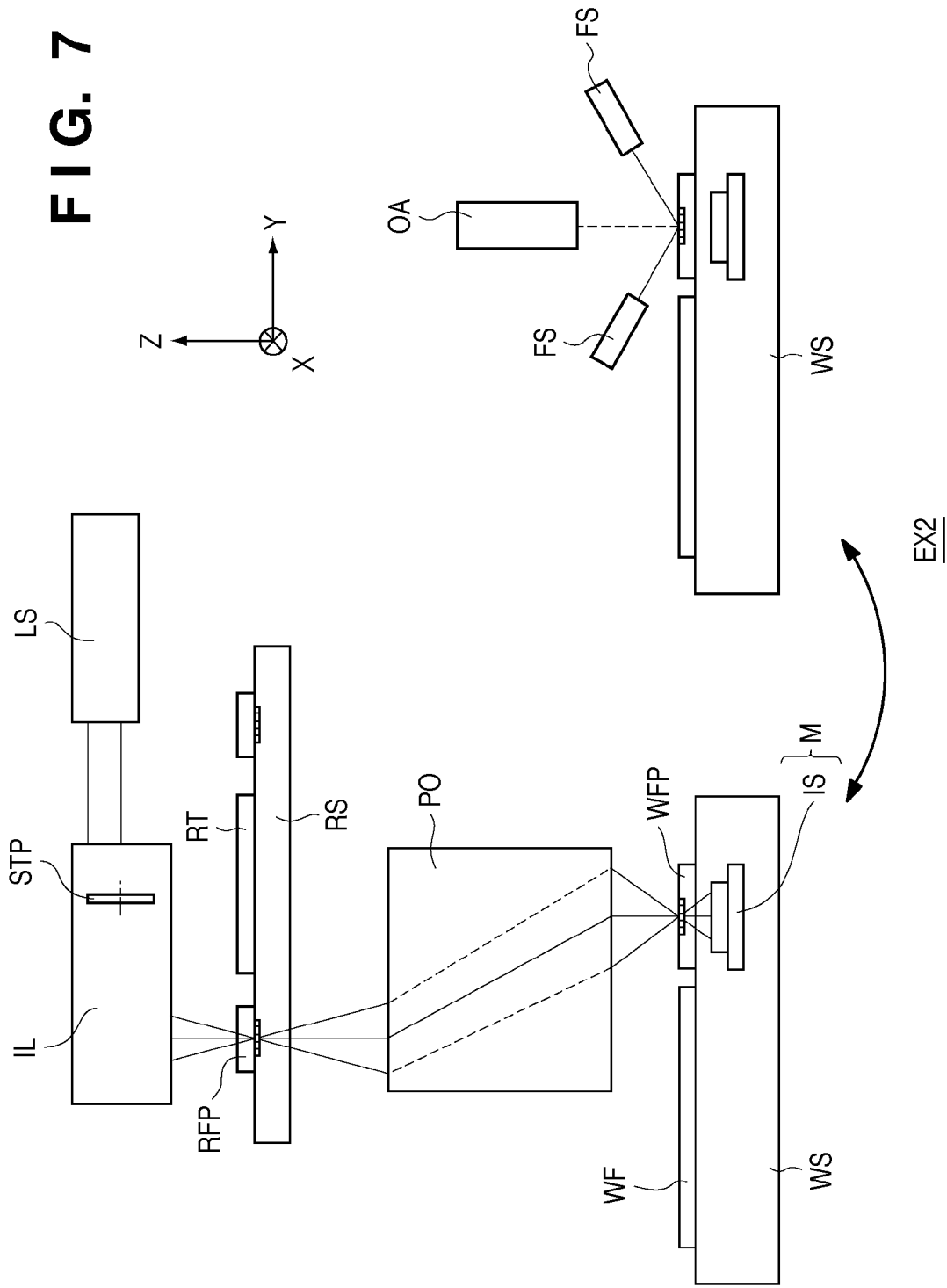
FIG. 7 is a view illustrating a twin-stage type exposure apparatus.

A twin-stage type exposure apparatus will be explained. A twin-stage type exposure apparatus EX2 to be explained herein comprises two substrate stages WS which can hold a substrate WF, as illustrated in FIG. 7. The exposure apparatus EX2 comprises a measurement station used to measure the surface shape and position of the substrate WF on the substrate stage WS, and an exposure station which has a projection optical system PO and is used to expose the substrate WF to light.

The measurement station has a focus detection system FS for detecting the surface position of the substrate WF with non-exposure light by the grazing-incidence method, and an off-axis alignment detection system OA for detecting an alignment mark on the substrate WF with non-exposure light without the projection optical system PO. The focus detection system FS drives the substrate stage WS in the horizontal direction, thereby measuring defocus of the surface of the substrate stage WS (or substrate reference plate WFP) from the measurement origin of the focus detection system FS. The off-axis alignment detection system OA measures the positional relationship between the substrate WF and the substrate reference plate WFP. The measurement data obtained in the measurement station are associated with the coordinate position of the substrate stage WS and stored in a memory as a correction table.

After the measurement in the measurement station, the substrate stage WS moves to the exposure station. In the exposure station, the measurement system M performs the focus measurement and position measurement of the substrate stage WS using the substrate reference plate WFP. In exposing the substrate WF to light, the driving amount of the substrate stage WS relative to the position of the substrate reference plate WFP measured in the exposure station is calculated using the correction table stored in the memory, thereby performing the correction driving of the substrate stage WS.

In the exposure station, all substrates need to undergo the above-described measurement with high measurement accuracy. For this purpose, it is effective to change the exposure illumination condition to the measurement illumination condition as needed, as described above.

[First Modification]

If the reproducibility of alignment measurement of the TTL scheme falls short of the required exposure accuracy, it is necessary to set a measurement illumination condition different from the exposure illumination condition. Assume, for example, that the accuracy is 2 nm in measurement under an illumination condition such as high σ suitable for the TTL measurement, but it is 4 nm in measurement under the exposure illumination condition. If the required accuracy is not satisfied as in this case, illumination condition switching is necessary.

In the first modification, the illumination condition and alignment measurement accuracy are associated with each other and stored in a memory which the control unit CNT can access. If the required accuracy cannot be satisfied when measurement is performed under the exposure illumination condition, the control unit CNT determines the measurement illumination condition by looking up the memory. The relationship between the illumination condition and the alignment measurement accuracy can be determined based on simulation or actual measurement.

[Second Modification]

In the second modification, whether to set an illumination condition different from the exposure illumination condition is determined by predicting the effective light source distribution based on simulation or actual measurement. More specifically, illumination condition switching is necessary when the pole balance of the effective light source distribution is bad or illuminance nonuniformity is large under the exposure illumination condition.

The effective light source distribution and alignment measurement accuracy may be associated with each other and stored in a memory which the control unit CNT can access. If the required accuracy cannot be satisfied when measurement is performed under the exposure illumination condition, the control unit CNT may determine the measurement illumination condition by looking up the memory.

There are various effective light source measurement methods such as a method of measurement by arranging a sensor on the substrate stage WS, a method of measurement by arranging a sensor on the original stage RS, and a method of actually exposing and developing the substrate WF and evaluating the practical result.

[Third Modification]

In the above description, measurement is performed under an illumination condition different from the exposure illumination condition as needed. However, measurement may be always performed under an illumination condition different from the exposure illumination condition.

[Fourth Modification]

In the above description, the same illumination optical system IL is used as an optical system which illuminates the first marks in measurement and an optical system which illuminates the original RT in exposure. In the fourth modification, separate illumination optical systems are used as an optical system which illuminates the first marks in measurement and an optical system which illuminates the original RT in exposure.

Figure 8:
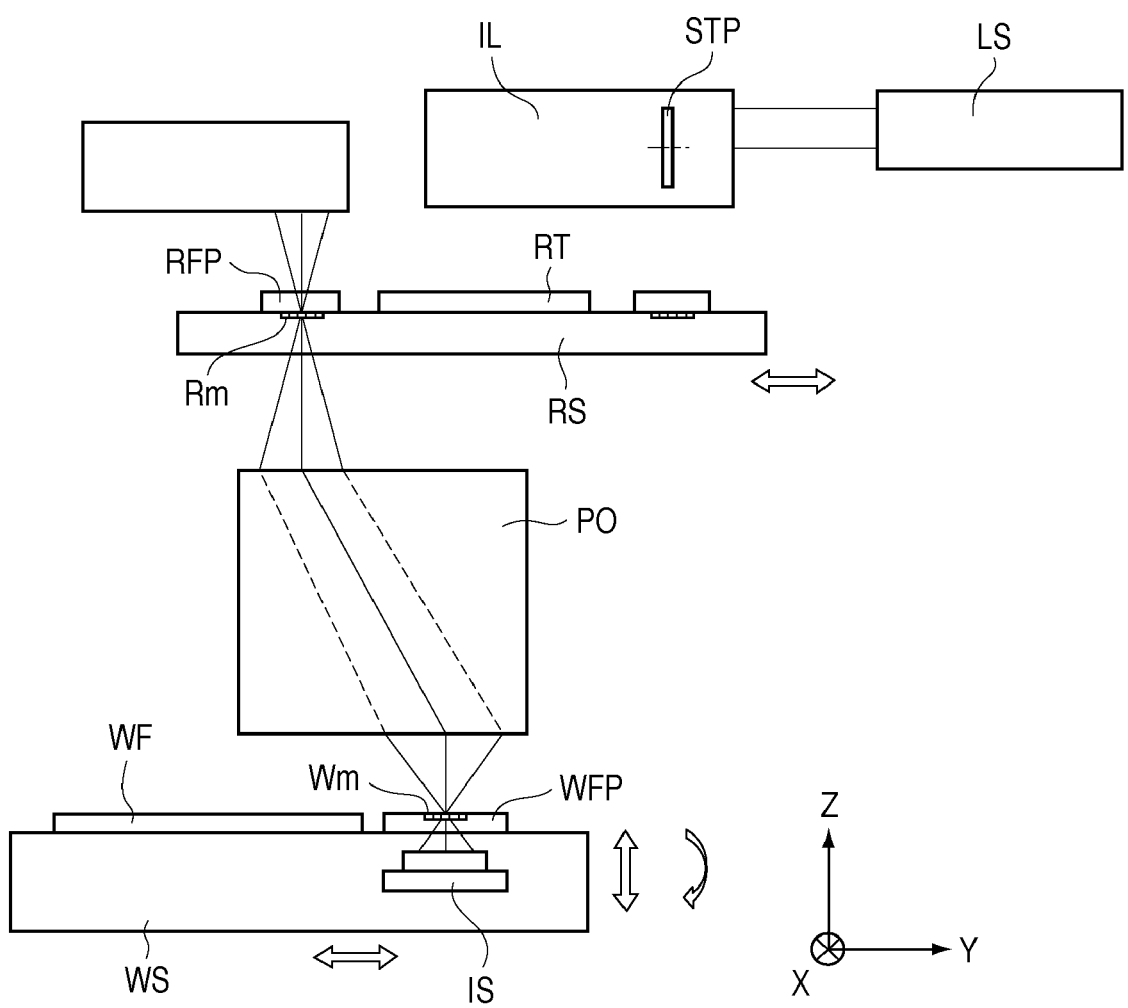
FIG. 8 is a view illustrating the schematic arrangement of an exposure apparatus having a measurement illumination optical system.
Figure 9:
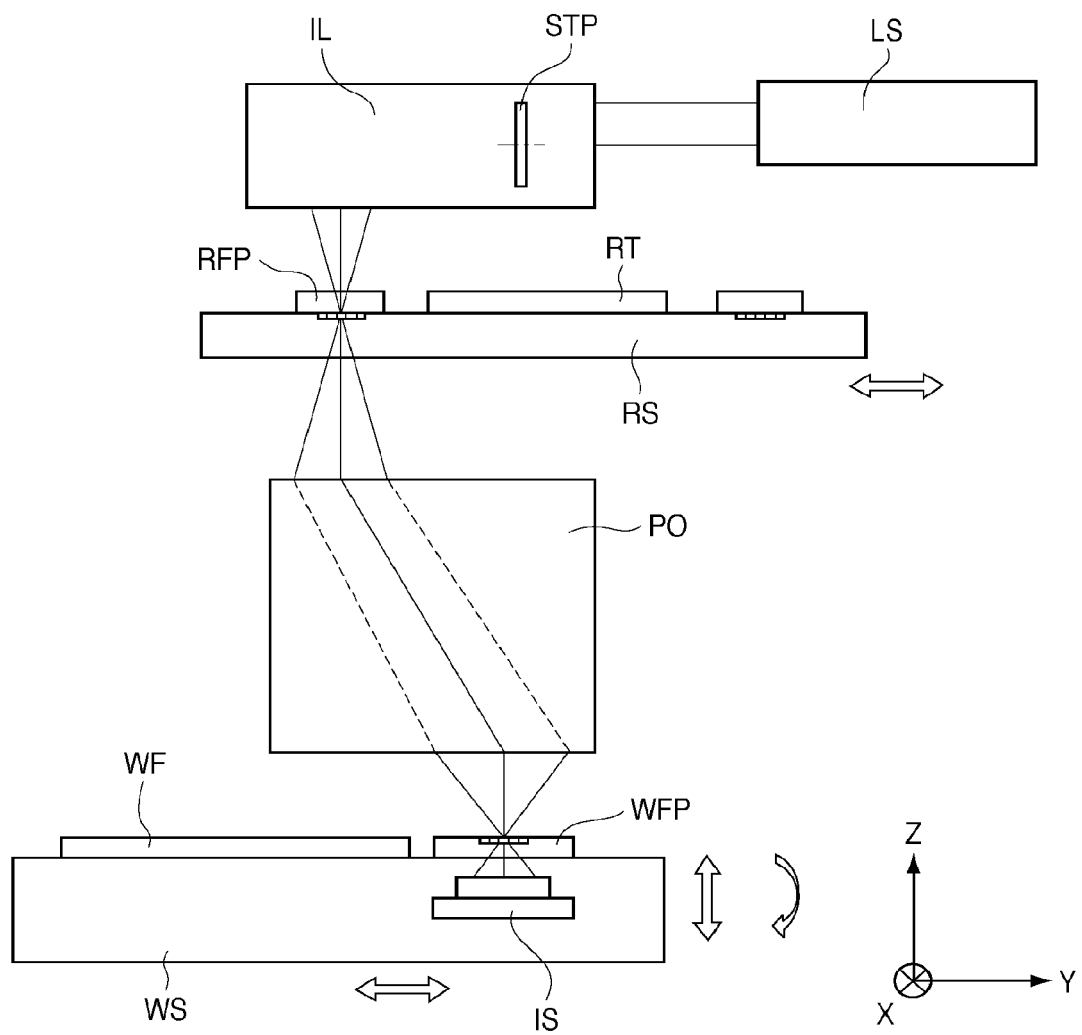
FIG. 9 is a view showing the schematic arrangement of an exposure apparatus.

FIG. 8 is a view illustrating the schematic arrangement of an exposure apparatus having a measurement illumination optical system. This exposure apparatus has an alignment optical system AS as the measurement illumination optical system. The alignment optical system AS illuminates the first marks Rm with illumination light having the same wavelength as that of exposure light.

The measurement uses the alignment optical system AS to illuminate the original reference plate RFP or original RT. Position measurement illumination using an optical system different from the illumination optical system IL obviates the need to insert the stop plate STP and diffractive optical elements for determining the position measurement illumination condition into the illumination optical system IL. This makes it possible to increase the degree of freedom of design of the illumination optical system IL, thus widening the range of choices of the exposure illumination condition.

As has been described above, according to the preferred embodiment of the present invention, an exposure apparatus capable of measurement under an illumination condition different from the exposure illumination condition is provided. This makes it possible to prevent a decrease in measurement accuracy attributed to an exposure illumination condition.

A device manufacturing method using the above-described exposure apparatus will be explained next. A device manufacturing method according to a preferred embodiment of the present invention is suitable to manufacture, for example, a semiconductor device and liquid crystal device. This method can include steps of transferring the pattern of an original onto a photosensitive agent applied on a substrate using the above-described exposure apparatus, and developing the photosensitive agent.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-169486, filed Jun. 26, 2007, which is hereby incorporated by reference herein in its entirety.

What is claimed is:

1. An exposure apparatus which includes an illumination optical system, an original stage which holds an original, a projection optical system, and a substrate stage which holds a substrate, and performs an exposure process of the substrate by illuminating the original by the illumination optical system such that an image of a pattern of the original is projected onto the substrate by the projection optical system, the apparatus comprising:

a measurement system configured to perform a measurement process for the exposure process using a mark arranged on the original stage and a mark arranged on the substrate stage; and a device configured to set an effective light source distribution on a pupil plane of the illumination optical system, wherein the device sets an effective light source distribution used in the measurement process so as to have a shape that is similar to a shape of an effective light source distribution used in the exposure process and so as to have an area that is larger than an area of the effective light source distribution used in the exposure process.

2. The apparatus according to claim 1, further comprising:

a control unit configured to select one of effective light source distributions; and a memory configured to store data which associating effective light source distributions formed for the exposure process with effective light source distributions formed for the measurement process, wherein the control unit refers to the table to select an effective light source distribution for the measurement process.

3. The apparatus according to claim 1, wherein preliminary measurement is performed using an effective light source distribution that is used for the exposure measurement and after the preliminary measurement is performed, an effective light source distribution used for the measurement process is determined based on a result provided by the preliminary measurement.

4. The apparatus according to claim 1, wherein the mark arranged on the original stage is provided to the original or a plate fixed on the original stage.

5. A method of performing an exposure process using an exposure apparatus that comprises:

an illumination optical system, an original stage which holds an original, a projection optical system which projects an image of a pattern of the original onto the substrate, a substrate stage which holds a substrate, and a device configured to set an effective light source distribution on a pupil plane of the illumination optical system, the method comprising:

performing a measurement process for an exposure process using a mark arranged on the original stage and a mark arranged on the substrate;

performing the exposure process based on a measurement result provided by the measurement process, wherein the exposure process is performed by illuminating the original by the illumination optical system such that an image of a pattern of the original is projected onto the substrate by the projection optical system, wherein in the measurement process, an effective light source distribution used in the measurement process is set by the device so as to have a shape that is similar to a shape of an effective light source distribution used in the exposure process and so as to have an area that is larger than an area of the effective light source distribution used in the exposure process.

6. A device manufacturing method comprising steps of:

exposing a substrate to light using an exposure apparatus; and developing the substrate, wherein the exposure apparatus includes an illumination optical system, an original stage which holds an original, a projection optical system, and a substrate stage which holds the substrate, and performs an exposure process of the substrate by illuminating the original by the illumination optical system such that an image of a pattern of the original is projected onto the substrate by the projection optical system, the exposure apparatus further includes a measurement system configured to perform a measurement process for the exposure process using a mark arranged on the original stage and a mark arranged on the substrate stage, and a device configured to set an effective light source distribution on a pupil plane of the illumination optical system, and wherein the device sets an effective light source distribution used in the measurement process so as to have a shape that is similar to a shape of an effective light source distribution used in the exposure process and so as to have an area that is larger than an area of the effective light source distribution used in the exposure process.

7. The apparatus according to claim 1, wherein preliminary measurement is performed using an effective light source distribution that is used for the exposure measurement, and when a result provided by the preliminary measurement is unsatisfactory, the measurement process is performed using an effective light source distribution that is different from the effective light source used for the exposure measurement, and data that associates the effective light source distribution used for the exposure process with the effective light source distribution used for the measurement process is stored.

8. The apparatus according to claim 1, wherein the effective light source distribution used in the measurement process and the effective light source distribution used in the exposure process are distributions in a normal illumination, and a σ value of the effective light source distribution used in the measurement process is larger than a σ value of the effective light source distribution used in the exposure process.

9. The apparatus according to claim 1, wherein the effective light source distribution used in the measurement process and the effective light source distribution used in the exposure process are distributions in an annular illumination, and an annular zone ratio of the effective light source distribution used in the measurement process is larger than an annular zone ratio of the effective light source distribution used in the exposure process.

10. The apparatus according to claim 1, wherein the effective light source distribution used in the measurement process and the effective light source distribution used in the exposure process are distributions in a multi-pole illumination, and an angle of aperture of the effective light source distribution used in the measurement process is larger than an angle of aperture of the effective light source distribution used in the exposure process.

11. The apparatus according to claim 1, wherein the measurement process includes at least one of a focus measurement of measuring a focal point of the projection optical system and an alignment measurement of measuring a relative position between the original stage and the substrate stage.

12. The apparatus according to claim 1, wherein a shape of the effective light source distribution used in the measurement process is the same as a shape of the effective light source distribution used in the exposure process.

* * * * *